United States Patent
Leibenzeder et al.

[11] 4,014,656
[45] Mar. 29, 1977

[54] MONITORING DEVICE FOR CRYSTAL PULLING APPARATUS

[75] Inventors: Siegfried Leibenzeder, Erlangen; Klaus-Dieter Schwarzmichel, Erlangen-Grossdechsendorf, both of Germany

[73] Assignee: Siemens Aktiengesellschaft, Munich, Germany

[22] Filed: Sept. 30, 1974

[21] Appl. No.: 510,631

[30] Foreign Application Priority Data

Oct. 3, 1973 Germany ............................ 2349736

[52] U.S. Cl. .............................. 23/273 SP; 156/601; 156/617 SP; 240/2 LC; 240/2 M; 350/96 R; 350/319; 356/44
[51] Int. Cl.² ..................................... B01J 17/18
[58] Field of Search ............... 23/301 SP, 273 SP; 356/44; 350/319, 96 R; 240/2.18, 2 LC, 2 M; 156/601

[56] References Cited
UNITED STATES PATENTS

| | | | |
|---|---|---|---|
| 2,912,321 | 1/1959 | Brennan | 23/301 SP |
| 3,051,035 | 8/1962 | Root | 356/44 |
| 3,051,038 | 8/1962 | Duke | 356/44 |
| 3,291,650 | 12/1968 | Dohmen | 156/601 |
| 3,692,499 | 9/1972 | Andrychuck | 23/273 SP |
| 3,718,757 | 2/1973 | Gulitz | 23/301 SP |
| 3,745,834 | 7/1973 | Veltze | 356/44 |
| 3,865,554 | 2/1975 | Wenkus | 23/301 SP |

FOREIGN PATENTS OR APPLICATIONS

| | | | |
|---|---|---|---|
| 1,214,679 | 12/1970 | United Kingdom | 156/601 |
| 823,164 | 11/1959 | United Kingdom | 156/601 |

OTHER PUBLICATIONS

IBM Tech. Discl. Bulletin (Corburn), vol. 15, No. 4, Sept., 1972, pp. 1334-1335.

*Primary Examiner*—Stephen J. Emery
*Attorney, Agent, or Firm*—Kenyon & Kenyon Reilly Carr & Chapin

[57] ABSTRACT

An improved monitoring device for monitoring a crystal pulling process taking place in a high pressure drawing chamber in which the mounting for a high pressure window at the same time encloses the end of a quartz rod whose other end projects freely into the drawing chamber ending in the vicinity of the melt with the mount inserted into the device in a pressure tight manner using a nipple threaded into the drawing chamber, the monitoring device permitting good observation of the process without precipitation of the volatile element of the semiconductor compound on the high pressure window.

4 Claims, 2 Drawing Figures

MONITORING DEVICE FOR CRYSTAL PULLING APPARATUS

BACKGROUND OF THE INVENTION

This invention relates to devices for pulling crystals such as mono-crystals and in particular straight mono-crystals from a molten compound such as a semiconductor compound containing a volatile element such as phosphorus, arsenic, selenium or sulphur in general and more particularly to an improved monitoring device for use in such a device.

In a recently developed crystal pulling device useful for pulling mono-crystals, and particular straight mono-crystals from a molten compound, preferably a semiconductor compound which contains a volatile component such as phosphorus, arsenic, selenium or sulphur, the device includes a high pressure drawing chamber arranged on a stand with the drawing spindle of a crystal mount led through the cover of the stand. The stand, the high pressure drawing chamber and the crystal mount are disposed one above the other symmetrical to the drawing axis. The crystal mount and the cover of the high pressure drawing chamber, which together with the side walls of the chamber are in the form of a bulb, form a structural unit mounted on the stand so as to be moveable in the direction of the drawing axis. The device is particularly well suited for the pulling crystals using the protective bath method. However, it is also applicable to other drawing methods such as the well known multiple temperature method.

In this crystal pulling device a monitoring arrangement with several observation windows is provided in the high pressure drawing chamber. A television camera common to all the observation windows is coordinated with them. Difficulties have arisen with this arrangement. It has turned out that the great temperature between the crucible, heated to approximately 1500° C and containing the melt in a protective bath, and the high pressure drawing chamber bulb, which is generally only a few e.g., about 2 cm, away and is cooled practically to room temperature, leads to a substantial termodiffusion of an inert gas contained in the chamber. This thermodiffusion hinders the observation of the crystal growth and thereby also hinders control of the pulling device during the drawing operation. It should be noted that the control of the pulling operation requires that even slight changes in the solid-liquid phase boundary and slight changes on the surface of the pulled crystal be accurately and exactly observed.

Although the pulling operation is carried out under considerable overpressure, preferably about 60 atm or more, which overpressure to a large degree prevents evaporation of the volatile component of the semiconductor compound, a condensation of this component on the observation windows can occur. As a result a cumbersome disassembly, cleaning and reassembly of the observation windows after each pulling operation can be necessary. Such is relatively costly. Furthermore it is quite possible that the relatively complicated, pressure tight observation windows can be damaged during repeated disassembly and reassembly.

In view of these difficulties, it is the object of the present invention to provide an improved monitoring device for monitoring such a process.

SUMMARY OF THE INVENTION

This object is accomplished, according to the present invention, by designing the high pressure window such that the window mount at the same time encloses the end of a quartz rod whose other end projects freely into the drawing chamber terminating in the vicinity of the melt. The mount is inserted into a cooled threaded nipple in the drawing chamber in a pressure tight manner. In the disclosed embodiment of the monitoring device only the high pressure window is inserted in a pressure tight manner in its mount with a special seal between the quartz rod and the mount. As a result the end of the quartz rod, which in a practical sense serves as an objective, is located in the immediate vicinity of the melt, i.e., it has a temperature considerably higher than that of the cooled pressure bulb and therefore of the high pressure window. As a result the possibility of precipitation on the face of the rod end is virtually eliminated since the free rod end remains in the zone of the drawing chamber where there is no substantial temperature drop relative to the immediate vicinity of the protective bath. In this zone, a thermodiffusion of the inert gas does not yet become a distrubing factor. As a result the monitoring device of the present invention requires relatively little service and permits observing the pulling process quite well.

In accordance with a further feature of the monitoring device of the present invention a plurality of such high pressure windows are distributed over the circumference of the drawing chamber bulb and so disposed that their angle of inclination relative to the pulling axis is different. As a result the quartz rod between each of the viewing windows is oriented towards a different area of the drawing chamber. This permits, for example, the observation of the area in which the seed crystal immerses in the melt at the start of the pulling operation through a window. Seed crystals generally have a small diameter of a few millimeters e.g., approximately 4 to 6 mm. The angle of inclination of another quartz rod can be oriented toward a part of the melt corresponding to that which the outside diameter of the crystal which is pulled out reaches as its diameter increases. An additional quartz rod can be oriented toward the crystal and itself.

DETAILED DESCRIPTION OF THE PREFERRED EMBODIMENT

Figure 1:
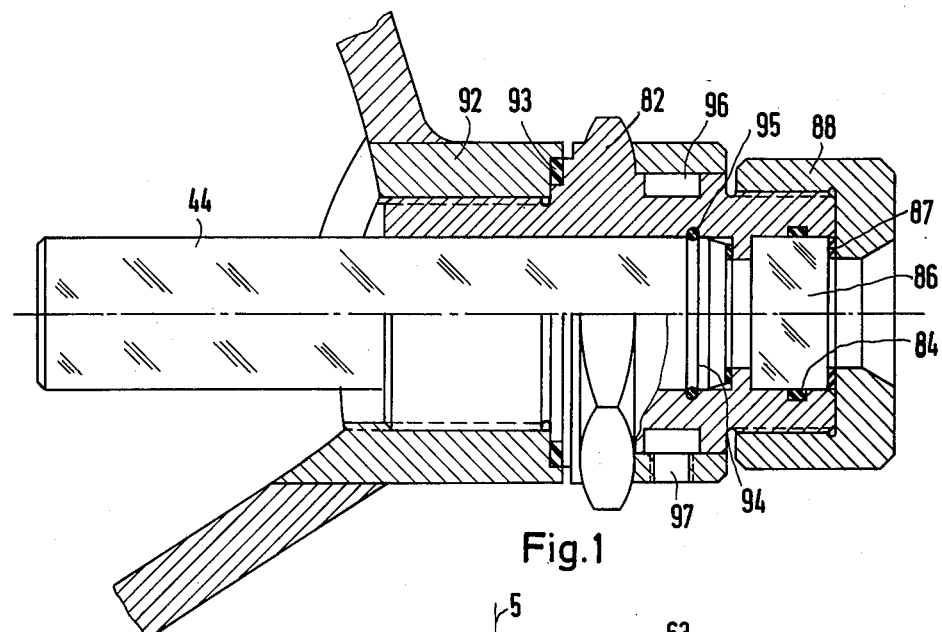
FIG. 1 is a schematic cross sectional view of an embodiment of the high pressure window of a monitoring device according to the present invention.

As illustrated on FIG. 1 the one end of the quartz rod, whose other free end is intended to project into a pulling chamber, is inserted into a hole in a threaded plug 82 which serves as a mount. Into another corresponding hole, at the opposite end of the threaded plug 82, a quartz pressure window 86 is inserted. The quartz window 86 is sealed therein with a seal 84. The pressure window 86 is furthermore securely fastened to the threaded plug 82 using a cap nut 88 and an annular gasket 87 sealing the window in place in a pressure tight manner. The mount 82 is screwed into a tapped nipple 92 and sealed therein by means of gasket 93. The tapped nipple 92 is attached to the cover 32 of a pulling chamber by welding or the like.

The quartz rod 44 is provided with means having as their only function keeping the inserted rod in its proper position. As illustrated, these means may comprise an annular groove 94 on the end of the quartz rod which is inserted into the mount 82. On the groove fits a split ring of round gasket material typically referred to as an O-ring. As shown, the O-ring is seated in an annular groove inside the mount 82. In order to insert the quartz rod 44 in a manner such that it will be properly fastened, the rod end is simply pushed into the mount until the O-ring 95 snaps into the groove 94 on the quartz rod 44.

Figure 2:
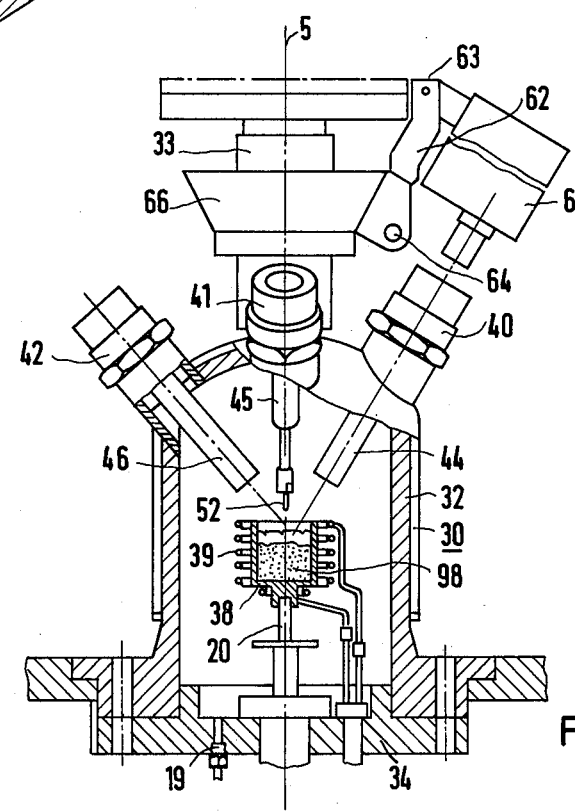
FIG. 2 is a similar view illustrating a plurality of devices such as that of FIG. 1 arranged at different angles of inclination to observe different portions of the process.

The tapped nipple 92 is included in a coolant circulation system, not specifically shown on the drawing, provided for the bulb 32 of the drawing chamber 30, shown in more detail on FIG. 2. As a result the nipple temperature will not materially exceed the coolant temperature and typically will be in the range of 50° to 80° C. On the other hand, the free end of the quartz rod 44 is located in an area of the drawing chamber where the temperature is preferably at least 500° C and in particular about 600° C.

A separate liquid coolant is provided for the mount 82. For this purpose it can advantageously be provided with a covered annular channel 96 through which a coolant such as water may be directed, the coolant entering and leaving through inlets and outlets 97 such as those shown on the drawing. As a result the cavity filled with inert gas between the high pressure window 86 and the enclosed end of the rod 44 will have a temperature which is not substantially higher than the coolant temperature.

FIG. 2 illustrates a number of the arrangements such as that of FIG. 1 installed in a high pressure drawing chamber. The high pressure drawing chamber 30 includes an essentially flat bottom 34 and a bulb 32. Within the high pressure drawing chamber 30 a crucible 38 equipped with a heating device 39 having leads going through the bottom is provided. The bottom also has a connection 19 for a vacuum pump. The crucible 38 is supported on a spindle 20 which also goes through the bottom 34 of the drawing chamber and is driven axially by a mechanism not illustrated. A plurality, such as the three illustrated, of high pressure windows 40, 41 and 42 according to the present invention are distributed around the circumference of the bulb 32. These have quartz rods 40, 45 and 46 respectively projecting from the windows a distance into the drawing chamber 30 such that the free ends of the quartz rods are in the immediate vicinity of the crucible 38 which is generally heated to a temperature at least near 1000° C. For example with a gallium-phosphide melt 98 in the crucible the crucible 38 will have a temperature slightly above 1475° C during the drawing operation. The centerline of the quartz rod 44 should be oriented, for example, to intersect the drawing axis indicated by a dot-dash line 5, approximately at the level of the melt 98. With this arrangement it will be possible to observe the melt disposed around a seed crystal 52 at the beginning of the pulling operation through the high pressure window 40. As the length of the pulled crystal increases its diameter generally also increases a considerable amount up to at least 40 mm, for example, and in some case to approximately 80 mm and more. In view of this, the window 42 may be used for observing a pulled crystal. Thus, as illustrated the centerline of its quartz rod 46 is more inclined relative to the drawing axis. The third observation window 41 whose quartz rod is shown as being a shorter length will then preferably be used for the observation of the pulled crystal after it has reached its final diameter.

For the purpose of monitoring the drawing process a television camera 60 is provided along with a mount 66 rotable about the drawing axis 5. The camera 60 is coupled to the mount 55 which is fastened to an extended neck 33 of the bulb 32, on which it is intended to attach a crystal mount including associated drive mechanisms, using a flange not shown in detail on the drawing. The angle of inclination of the television camera 60 may be adjusted using a swiveling device 62. In order to accomplish this the swiveling device 62 is provided with joints 63 and 64. Thus, through simple manipulation it is possible to align the optical axis of the television camera with the axis of any of the crystals, i.e., to any of the individual observations windows 40, 41 or 42.

Thus an improved monitoring device for crystal pulling equipment has been shown. Although a specific embodiment has been illustrated and described, it will be obvious to those skilled in the art that various modifications may be made without departing from the spirit of the invention which is intended to be limited solely by the appended claims.

What is claimed is:

1. In a monitoring device for crystal pulling equipment in which crystals are pulled from a melt in a crucible disposed on a stand inside a high pressure drawing chamber and through the cover of which the drawing spindle of a crystal mount is led and in which the equipment stand, the high pressure drawing chamber and crystal mount are disposed one above each other symmetrical to the drawing axis, the upper portion of the high pressure drawing chamber forming a bulb which is provided with a plurality of observation windows which may be viewed using a common television camera the improvement in said observation windows comprising:
   a. a cooled tapped nipple in the drawing chamber;
   b. a high pressure-tight mount inserted in said cooled tapped nipple;
   c. a high pressure window sealed in the outside end of said mount; and
   d. a quartz rod sealed into said mount and extending through the inside end thereof, said quartz rod projecting freely into the drawing chamber with its end in the immediate vicinity of the melt in the zone of the drawing chamber where there is no substantial temperature drop relative to the temperature of the melt.

2. A device according to claim 1 and further including an enclosed annular channel within said mount to which coolant from a cooling system can be provided.

3. A device according to claim 2 wherein a plurality of said monitoring devices are provided, and wherein the centerline of the quartz rods associated therewith are oriented toward different zones within the drawing chamber.

4. A device according to claim 1 wherein a plurality of said monitoring devices are provided, and wherein the centerline of the quartz rods associated therewith are oriented toward different zones within the drawing chamber.

* * * * *